United States Patent
Wang et al.

(10) Patent No.: US 6,672,864 B2
(45) Date of Patent: Jan. 6, 2004

(54) METHOD AND APPARATUS FOR PROCESSING SUBSTRATES IN A SYSTEM HAVING HIGH AND LOW PRESSURE AREAS

(75) Inventors: Hougong Wang, Pleasanton, CA (US); Zheng Xu, Santa Cruz, CA (US); Kenny King-Tai Ngan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/229,879

(22) Filed: Aug. 27, 2002

(65) Prior Publication Data

US 2003/0044742 A1 Mar. 6, 2003

Related U.S. Application Data

(60) Provisional application No. 60/316,632, filed on Aug. 31, 2001.

(51) Int. Cl.[7] .................................................. F27D 3/16
(52) U.S. Cl. ........................ 432/5; 432/171; 432/243; 414/217; 414/804
(58) Field of Search .............................. 432/5, 86, 124, 432/129, 141, 163, 171, 243; 414/217, 939, 805, 804; 118/50.1, 725

(56) References Cited

U.S. PATENT DOCUMENTS

| 5,512,320 | A | * | 4/1996 | Turner et al. ........... 427/255.21 |
| 5,609,689 | A | | 3/1997 | Kato et al. |
| 5,902,088 | A | | 5/1999 | Fairbairn et al. |
| 5,909,994 | A | | 6/1999 | Blum et al. |
| 5,944,857 | A | | 8/1999 | Edwards et al. |
| 5,997,588 | A | | 12/1999 | Goodwin et al. |
| 6,048,154 | A | | 4/2000 | Wytman |
| 6,059,893 | A | | 5/2000 | Kawasaki |
| 6,110,232 | A | | 8/2000 | Chen et al. |
| 6,113,698 | A | | 9/2000 | Raaijmakers et al. |
| 6,140,256 | A | * | 10/2000 | Ushikawa .................... 438/795 |
| 6,202,318 | B1 | | 3/2001 | Guldi et al. |
| 6,235,656 | B1 | | 5/2001 | Clarke |
| 6,338,626 | B1 | * | 1/2002 | Saeki ......................... 432/243 |
| 6,435,868 | B2 | * | 8/2002 | White et al. ................. 432/247 |

FOREIGN PATENT DOCUMENTS

| EP | 1058291 | 12/2000 |
| EP | 1109203 | 6/2001 |
| JP | 2045920 | 2/1990 |
| JP | 6314730 | 11/1994 |

OTHER PUBLICATIONS

U.S. patent application No. 09/464,362 filed Dec. 15, 1999 (Atty Dkt 3790/7017); 53 pp.
US 09/903,218 filed Jul. 10, 2001 (23 pp).

* cited by examiner

Primary Examiner—Gregory Wilson
(74) Attorney, Agent, or Firm—Konrad, Raynes, Victor & Mann

(57) ABSTRACT

A positive pressure gradient is maintained across an open access port of an interface chamber such as a load lock chamber which provides an interface between a low pressure chamber such as a transfer or buffer chamber, and a high pressure area such as a staging area or factory interface area. When the access port of the interface chamber is open to the high-pressure area, the positive pressure gradient may be used in some applications to inhibit the flow of gasses from the high-pressure area into the interior of the interface chamber.

20 Claims, 6 Drawing Sheets

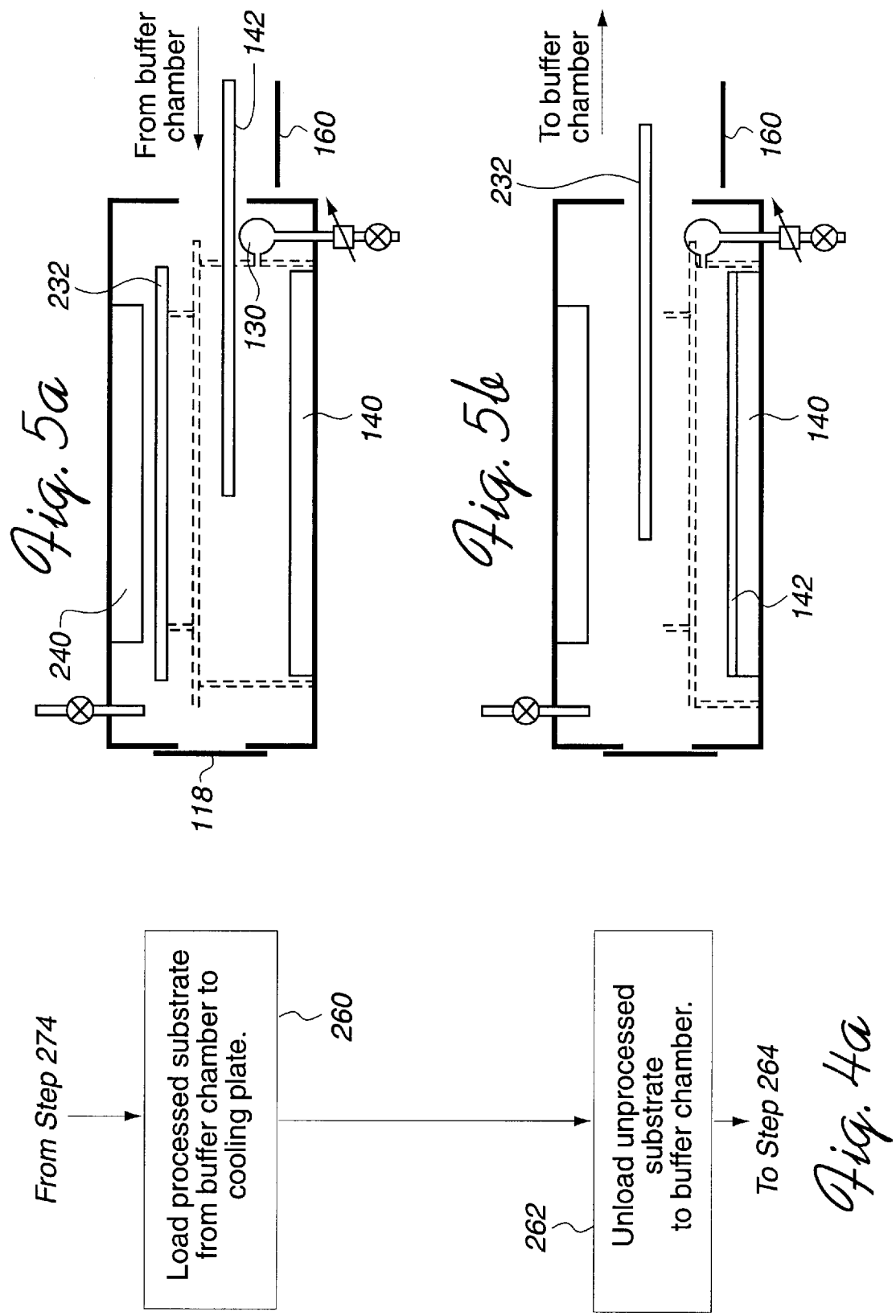

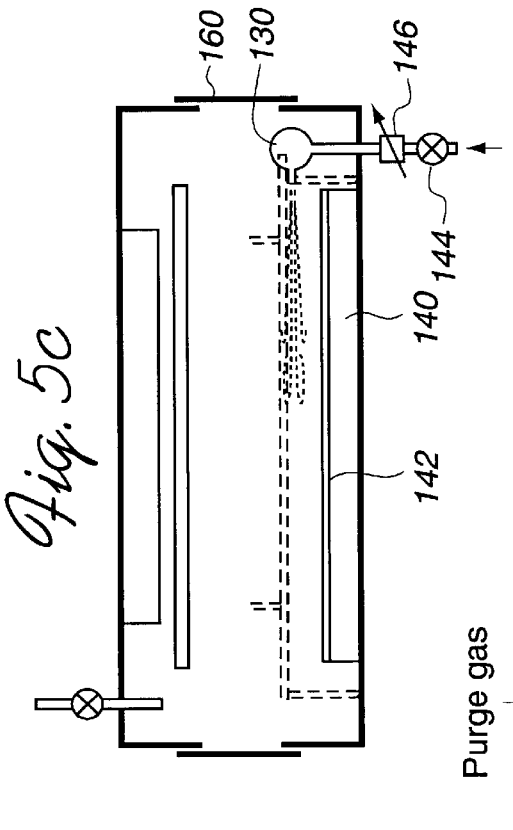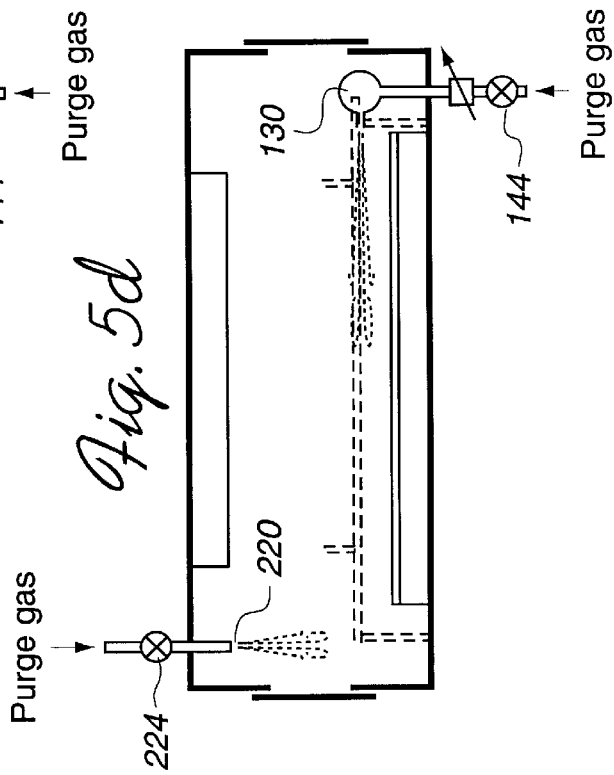

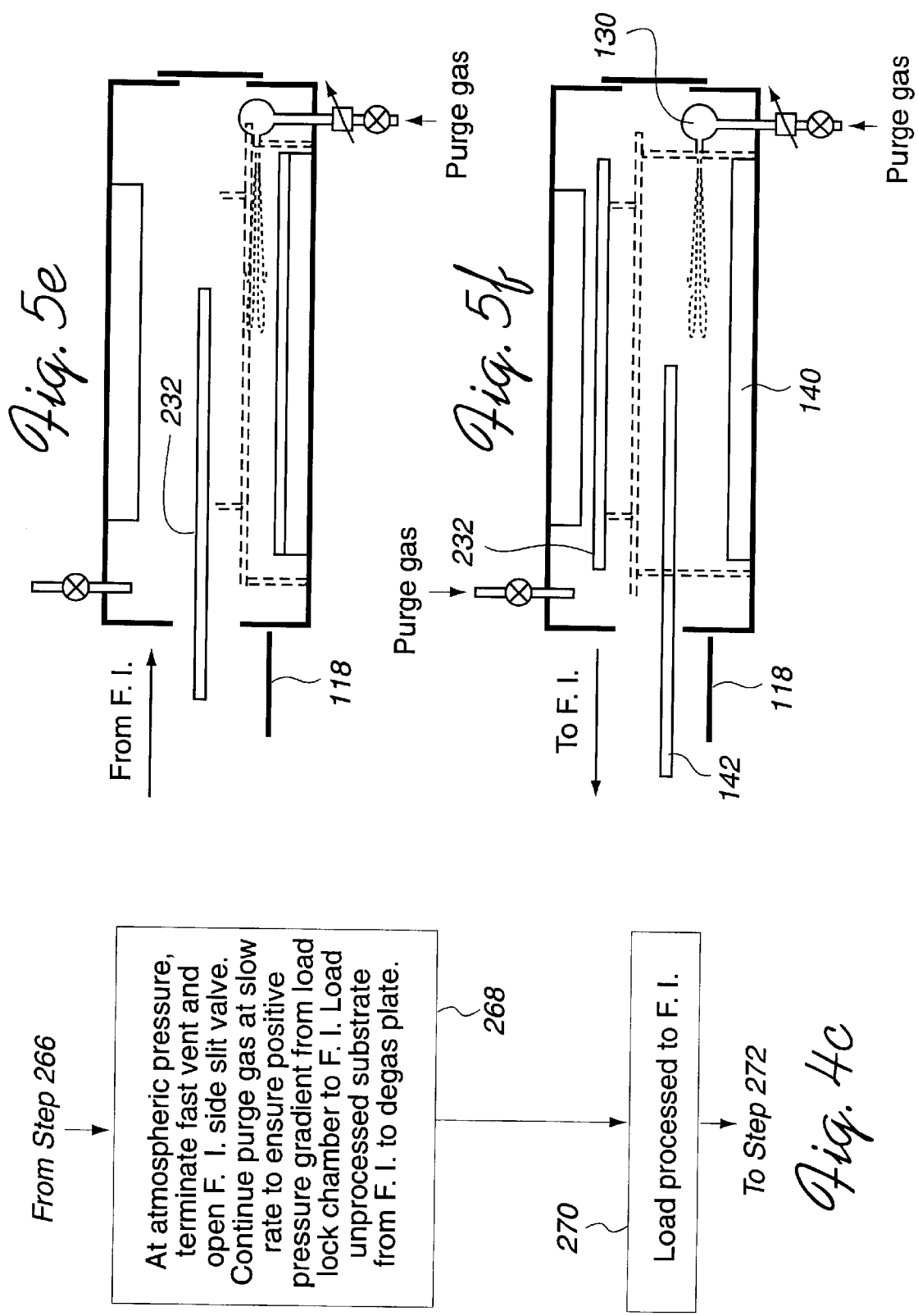

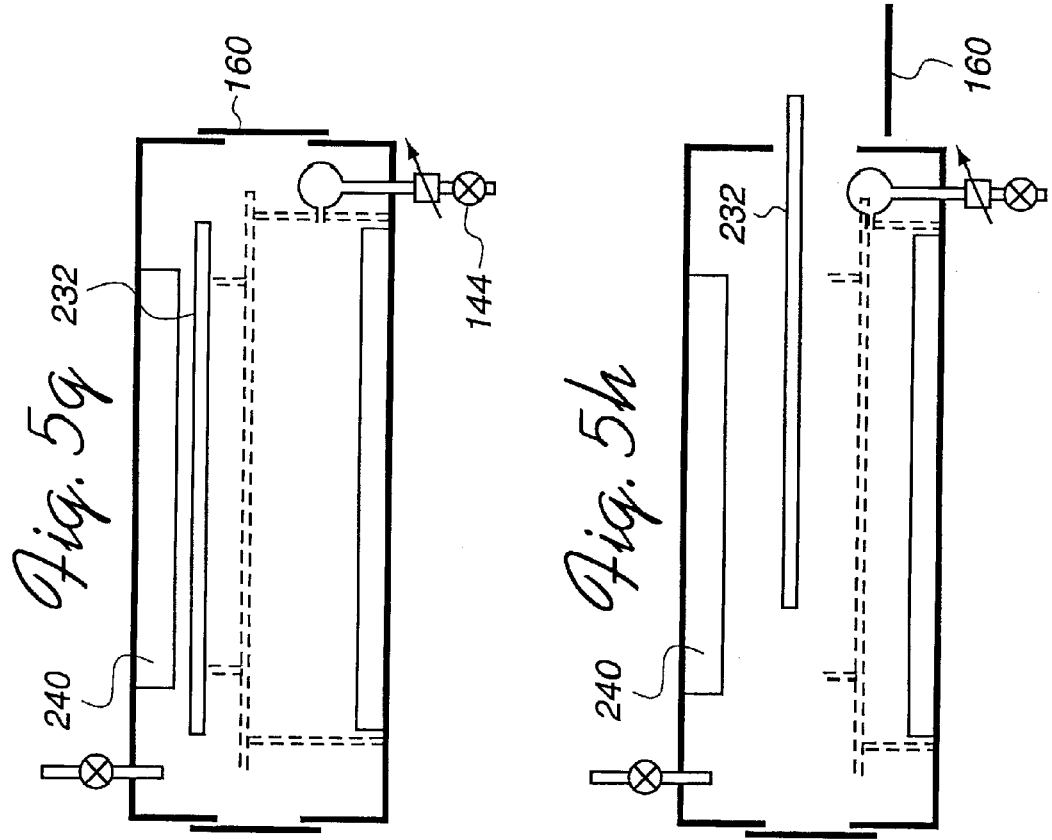
Fig. 5g
Fig. 5h
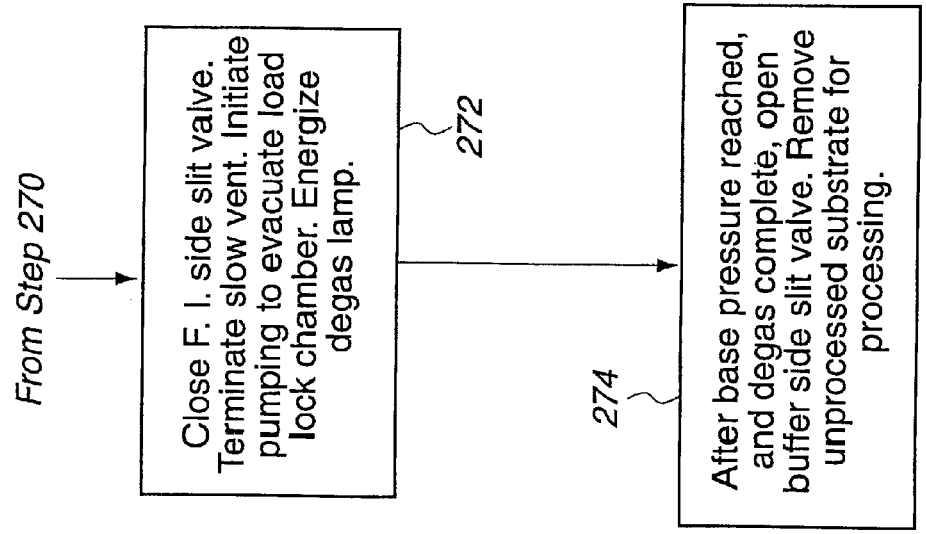
Fig. 4d

METHOD AND APPARATUS FOR PROCESSING SUBSTRATES IN A SYSTEM HAVING HIGH AND LOW PRESSURE AREAS

This application claims priority from U.S. Provisional Application No. 60/316,632, filed Aug. 31, 2001, which is incorporated herein by reference.

BACKGROUND

The present invention relates generally to the transfer of substrates typically used in the fabrication of electronic devices such as integrated circuits and flat panel displays. Specifically, the invention relates to an interface chamber such as a loadlock chamber used to transfer substrates from one environment to another environment in a processing system.

Vacuum processing systems are often used in the fabrication of integrated circuits and flat panel displays. For example, one typical vacuum processing system includes a centralized transfer chamber mounted on a monolith platform or mainframe structure. One or more process chambers are in communication with the transfer chamber via access ports and associated slit valves through which the substrates are transferred between the transfer chamber and the adjoining process chambers.

Substrates are passed through the system by a substrate handling robot disposed in the transfer chamber. The slit valves isolate the process chambers from each other and from the transfer chamber while substrates are being processed. The transfer chamber is typically held at a constant vacuum, while the process chambers may be pumped to a greater or lesser vacuum than the transfer chamber for performance of their respective processes. Afterward, the process chamber pressure returns to the level in the transfer chamber before opening the slit valve to permit access between the chambers.

The substrate handling robot disposed in transfer chamber typically retrieves one or more unprocessed substrates from one or more loadlock chambers connected to the transfer chamber and places the substrates in the process chambers. The loadlock chambers selectively cycle between the pressure level of the ambient environment and the pressure level in the transfer chamber to transition the substrates between atmospheric pressure and the vacuum environment of the transfer chamber. One type of loadlock chamber in widespread use has a relatively large volume and is capable of storing multiple substrates. Typically, thirteen to twenty-five substrates are stacked vertically in one or more substrate cassettes disposed in loadlock chambers. The substrate cassettes typically include a plurality of substrate supports spaced vertically to permit a substrate handling robot blade to reach under a substrate to remove or place a substrate. Substrates are typically loaded in and removed from the loadlock chamber by a staging robot at or near a front-end staging area, which is also often referred to as the "factory interface."

Typically, the factory interface area is maintained at or near ambient or atmospheric pressure. Accordingly, prior to transfer of substrates into or out of the loadlock chamber, the atmospheric volume within the loadlock chamber is usually vented to atmospheric pressure before opening the valves of the loadlock chamber. Similarly, before transfer of substrates between the loadlock chamber and the transfer chamber, the atmospheric volume within the loadlock chamber is usually evacuated to the low pressure maintained in the transfer chamber. Because of the sizable volume within typical loadlock chambers, it may take a relatively lengthy amount of time to vent and then evacuate the loadlock chamber before permitting access to the substrates by the substrate handling robot. This process may typically take approximately four (4) minutes to complete in some applications. During this time, the vacuum processing system may sit idle while awaiting the introduction of additional unprocessed substrates into the system.

It has been found that substantial production gains may be made by reducing the atmospheric volume within the loadlock chamber serving the transfer chamber. Accordingly, systems having single or dual substrate loadlock chambers have been developed to reduce venting and evacuation time within the loadlock process chamber, which has resulted in a reduction of process chamber idle time and an increase in production. Examples of such loadlock chambers include those described in application Ser. No. 137,324, filed Jun. 3, 1999 and application Ser. No. 505,901 filed Feb. 17, 2000 (having counterpart EP 1058291 published Dec. 6, 2000); and application Ser. No. 464,362, filed Dec. 15, 1999 (having counterpart EP 1109203 published Jun. 20, 2001), which are incorporated herein by reference.

A reduction in the number of substrates housed in the loadlock chamber often makes it desirable to increase the speed at which the substrates are transferred through the loadlock chamber. However in many applications it is desirable to heat the substrates prior to processing in the processing chambers. Heating the substrate may for example assist in degassing undesirable contaminant gasses such from the substrate prior to introducing the substrate into the main processing system. In those applications in which the substrate is heated in the loadlock chamber prior to processing, a shorter transition time through the loadlock chamber reduces the time available to heat the substrates in the loadlock chamber.

SUMMARY

The present inventions are directed to, in one aspect, a method and apparatus for processing a semiconductor substrate in a system which includes a chamber having a valve such as a slit valve wherein the interior of the chamber is vented with a purge gas to a pressure greater than the pressure external to the valve to provide a positive pressure gradient between the chamber interior and the valve external pressure. Upon opening the chamber valve to permit a substrate to be loaded into or removed from the chamber, purge gas is continued to be admitted into the chamber interior while the chamber valve is open to maintain a positive pressure gradient while said chamber valve is open. In some applications, such a positive pressure gradient may be used to inhibit the passage of contaminant gasses from the exterior of the chamber to the interior while the slit valve is open.

Once the chamber valve is closed, the chamber may be pumped down to a lower pressure and heating of the substrate may be initiated. In one embodiment, the chamber may be a load lock chamber having a heater to degas the substrate. The chamber slit valve may provide access to a factory interface which is at ambient pressure. In some applications, it is appreciated that the degassing of a substrate in a load lock chamber may be initiated at higher pressures and thus earlier in completion of the pumping cycle where the admission of contaminant gasses is inhibited by a positive pressure gradient maintained when the slit valve to the factory interface is open.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments could be made without departing from the spirit or scope of the inventions. The preceding summary therefore is not meant to limit the scope of the inventions. Rather, the scope of the inventions is to be determined by appended claims and their equivalents.

DRAWINGS

Embodiments of the invention are now described with reference to the appended drawings, in which:

FIGS. 4a–4d depict a flow chart representing an example of a method of operating the system of FIG. 1.

FIGS. 5a–5h are side schematic views of the loadlock chamber of FIG. 1 depicting corresponding steps of the process of FIG. 4.

DESCRIPTION

Figure 1:
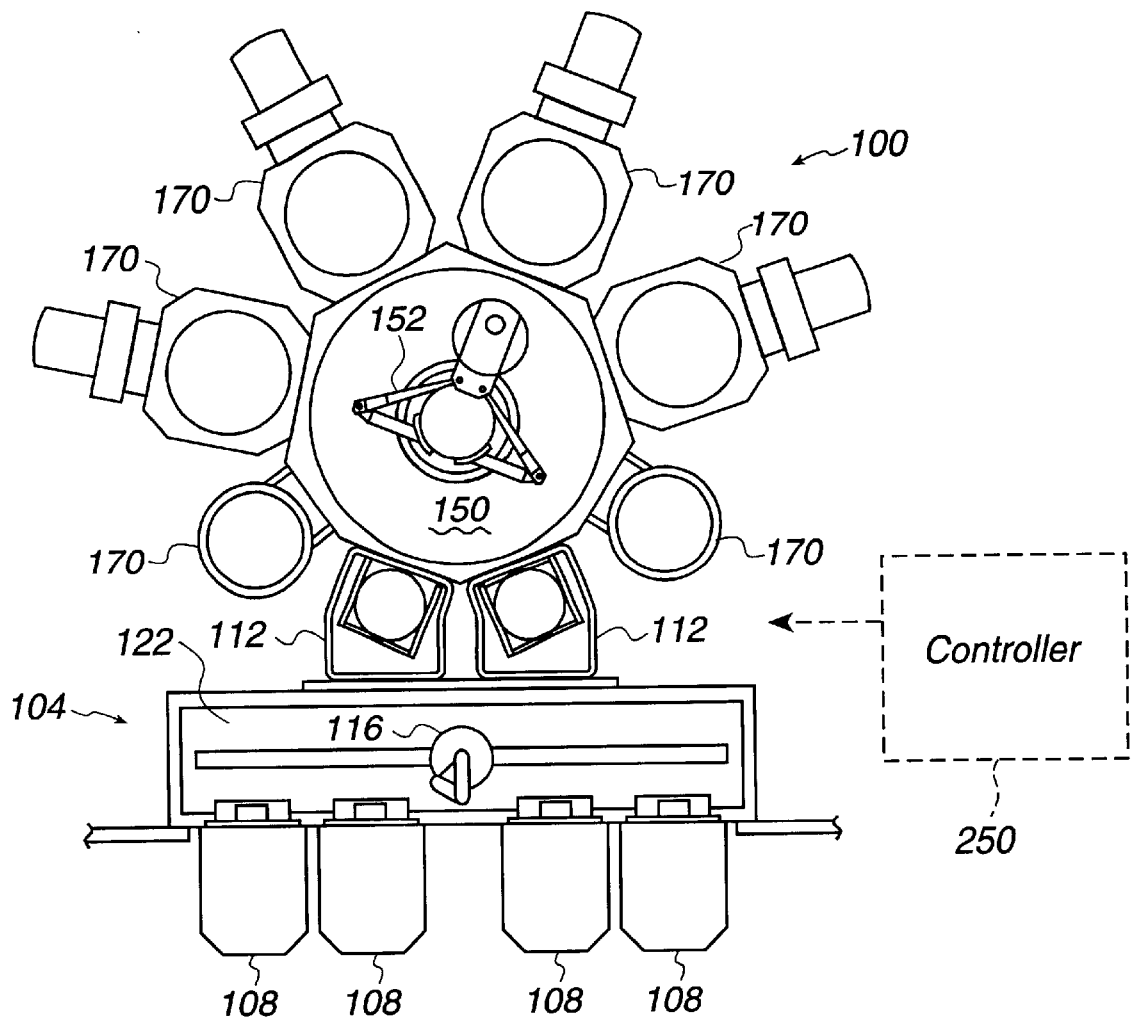
FIG. 1 is a top schematic view of a first embodiment of a vacuum system in accordance with the present invention.

A vacuum processing system in accordance with one embodiment of the present invention is indicated generally at 100 in FIG. 1. The vacuum processing system 100 generally includes a factory interface or front-end staging area 104 where substrate cassettes 108 are supported and substrates are loaded into and unloaded from one or more loadlock chambers 112. The factory interface area 104 includes a staging robot 116 which unloads an unprocessed substrate from one of the cassettes 108 and loads the unprocessed substrate into a loadlock chamber 112. In the illustrated embodiment, the staging robot 116 of the factory interface area 104 operates in an atmosphere which is at or near the ambient (atmospheric) pressure which is approximately 760 Torr. It is appreciated that in some applications, the front-end area may have a pressure which is greater than or less than ambient.

Figure 2:
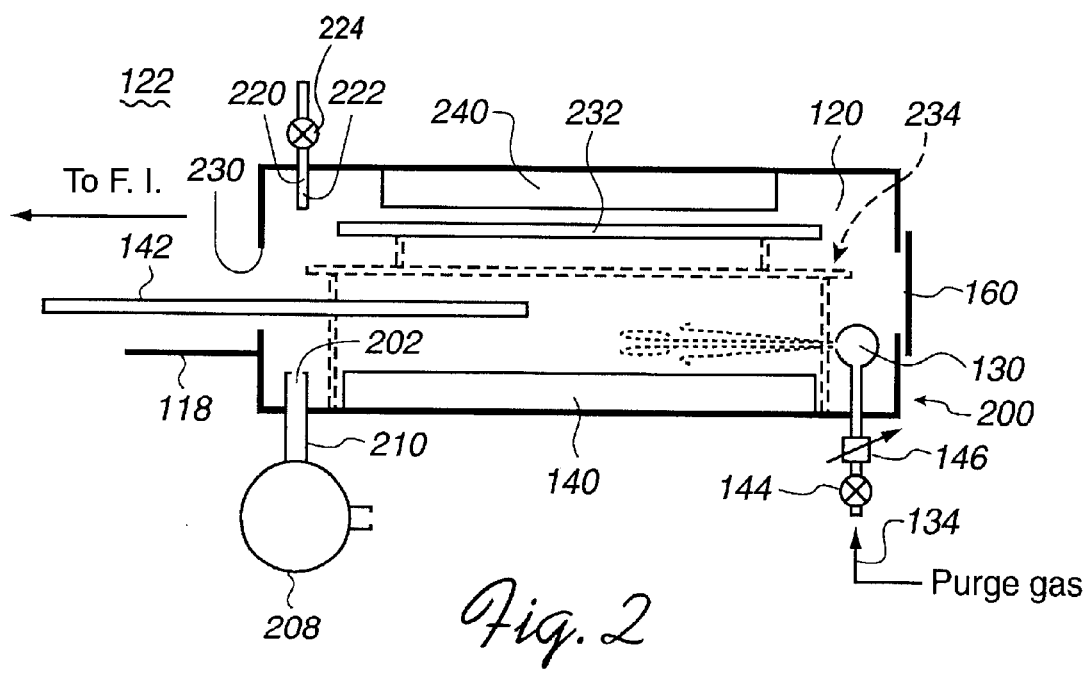
FIG. 2 is a side schematic view of the loadlock chamber of FIG. 1.

As best seen in FIG. 2, the loadlock chamber 112 has a slit valve 118 which opens to permit access to the interior 120 of the loadlock chamber. The staging robot 116 passes an unprocessed substrate through the opened slit valve 118 and deposits it in the chamber 112. In addition, the robot 116 removes a processed substrate through the opened valve 118. In accordance with one aspect of the present inventions, the loadlock chamber provides a positive pressure gradient between the interior 120 of the chamber and pressure of the front-end area 104 while the slit valve 118 is open to the factory interface area 104. By a positive pressure gradient, it is meant that the interior pressure of at least some if not all of the chamber 112 is somewhat higher than that of the factory interface area 104 notwithstanding the open slit valve 118 between the chamber interior 120 and the loadlock chamber exterior 122 within the front end area 104 surrounding the robot 116.

Figure 3:
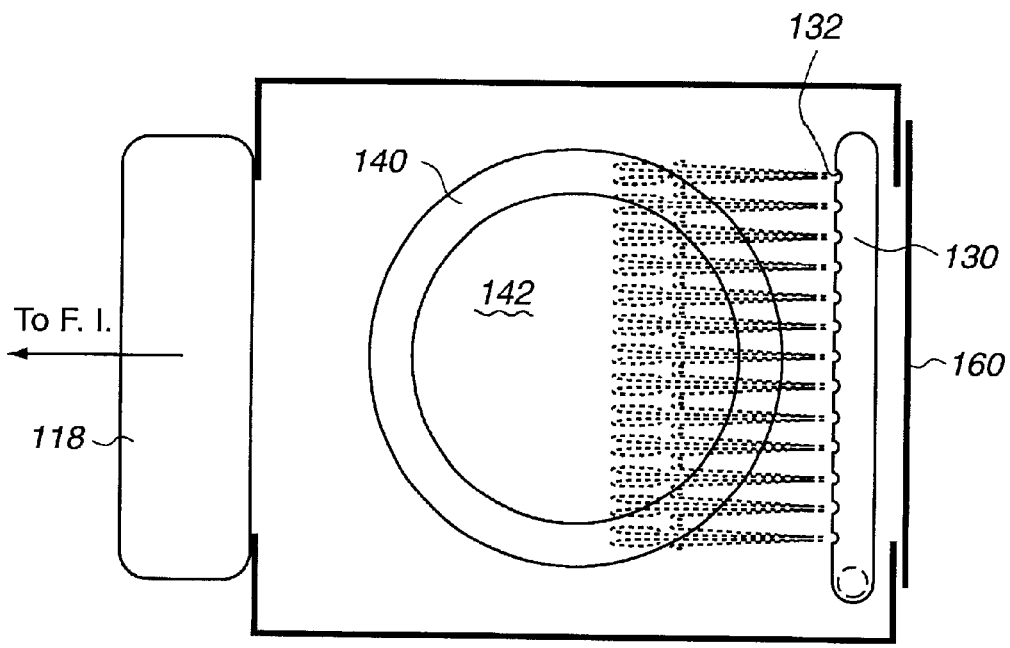
FIG. 3 is a top schematic view of the cooling plate and gas injector of FIG. 2.

In the illustrated embodiment, the positive pressure differential is maintained by injecting a gas such as a purge gas into the chamber so that the pressure within the loadlock chamber interior 120 is greater than that of the chamber exterior 122 adjacent the robot 116 while the slit valve 118 on the factory interface side is open. The purge gas, which may be one of (or a combination of two or more of) argon, helium, nitrogen, hydrogen, or other suitable purge gasses, is injected into the chamber 112 through a suitable inlet 130. As best seen in FIG. 3, in the illustrated embodiment, the inlet 130 is formed as an elongated manifold having a plurality of orifices 132 distributed linearly adjacent to and above a cooling plate 140 upon which a processed substrate 142 is supported. In addition to maintaining the positive pressure differential, the orifices 132 may be positioned to direct a flow of gas over the surface of the substrate 142 to remove particles that may have deposited onto the substrate. Copending application Ser. No. 09/903,218, filed Jul. 10, 2001, assigned to the assignee of the present application and incorporated by reference in its entirety, describes a multi-substrate cooling chamber having a gas injector, which is similarly shaped to dislodge particles from the surface of a substrate being cooled in the chamber. It is appreciated that the inlet 130 may have a variety of shapes, depending upon the particular application. For example, the inlet 130 may be a simple single orifice inlet or may have several inlets distributed to provide the desired pressure gradient in the interior of the chamber 112.

It is believed that maintaining a positive pressure gradient while the factory interface side slit valve is open will have one or more of various advantages, depending upon the application. For example, as will be explained in greater detail below, in one application it is believed that injecting a purge gas into the loadlock chamber 112 while the slit valve 118 is open may permit a degassing operation to be initiated more quickly once the slit valve 118 is closed and the loadlock chamber is being pumped down. Consequently, the degassing operation may be completed more quickly permitting an improvement in throughput. In other applications, a different advantage may result, depending upon the particular application.

The system 100 includes a purge gas supply line 134 which is coupled to the gas inlet 130 via a control valve 144. The flow rate through the inlet 130 may be regulated by a flow controller 146. In the illustrated embodiment, the flow rate through the gas inlet 130 is controlled to be in a range of 20–4000 standard cubic centimeters per minute (sccm) and more preferably 100–2000 sccm. The flow rate may of course, vary, depending upon the particular application.

The system 100 further includes a transfer or buffer chamber 150 (FIG. 1) which houses a transfer robot 152. Once the unprocessed substrate in the loadlock chamber 112 has been suitably degassed and the chamber 112 has been pumped down to or about the vacuum pressure of the transfer chamber 150, a slit valve 160 (FIG. 2) may be opened to provide access by the robot 152 to the interior 120 of the loadlock chamber 112. The transfer robot 152 removes the unprocessed wafer or panel from the loadlock chamber and transfers it to one or more of the processing chambers 170 arrayed around the perimeter of the transfer chamber 150. The processing chambers 170 may perform a variety of processes with the substrate including deposition of films by chemical vapor deposition or physical vapor (sputtering) deposition, etching, cleaning or other processes. Once the processing is complete, the transfer robot transfers the processed substrate to a loadlock chamber 112. Following venting of the loadlock chamber 112 to the pressure of the factory interface 104, the loadlock chamber 112 is opened on the factory interface side and the staging robot 116 removes the processed substrate and places it in a cassette. Preferably a positive pressure differential is maintained between the loadlock chamber interior and exterior while the factory interface side slit valve 118 is opened as described above.

The loadlock chamber 112 functions as a pressure interface chamber between the relatively low pressure of the transfer chamber 150 and the relatively high pressure of the factory interface area 104. The loadlock chamber 112 includes a pressure vessel 200 in which the interior 120 may be pumped down to the pressure of the transfer chamber 150. An exhaust port 202 is disposed through the bottom of the loadlock chamber 112 and is connected to an onboard vacuum pump 208 via an exhaust line 210. The onboard vacuum pump 208 is preferably disposed below the loadlock chamber 112 to pump down the loadlock chamber 112. The pump 208 may be, for example, a high vacuum turbo pump capable of providing milliTorr pressures with very low vibration. One vacuum pump used to advantage is available from BOC Edwards Vacuum Technology, Austin, Tex. However, other pumps such as roughing pumps, cryogenic pumps or the like could be used alone or in combination with one another.

In addition to the distributed gas injector inlet 130, the loadlock chamber 112 may optionally have a second larger gas inlet, referred to herein as a main gas inlet 220 which is disposed in a wall of the loadlock chamber 112 to reduce the time needed to vent the chamber interior up to the desired pressure level corresponding to the factory interface pressure level. The main inlet 220 may, like the gas injector inlet 130, be connected to a gas purge line 134 such as a nitrogen purge gas line, through a control valve 224. The inlet 220 may be shaped to function as a gas diffuser to distribute the purge gas along a larger surface area through a plurality of gas diffuser ports 222 disposed along the length of the inlet 220, thereby decreasing the time needed to vent the loadlock chamber 112 up to the desired pressure level.

In the illustrated embodiment, the gas flow through the main gas inlet 220 may be provided at a rate which provides a substantially greater flow of gas into the chamber interior 120. In some applications, the flow rate through the main inlet 220 may be unregulated. Thus, the gas flow through the main inlet can provide a "hard" or fast vent whereas the slower flow rate through the injector 130 can provide a "soft" or more controlled vent. The flow rate though the main inlet 220 may of course, vary, depending upon the particular application.

It should be noted that the atmospheric volume within the loadlock chamber 112 is desired to be as small as practical while providing suitable volume for operation of the components contained therein, thus providing for quick and efficient pump down and venting of the loadlock chamber 112. In the illustrated embodiment, the loadlock chamber 112 has a single processed substrate when the chamber is vented up in pressure and has a single unprocessed substrate when the chamber is pumped down in pressure. It is appreciated that loadlock chambers which can accommodate a greater number of substrates may be used as well.

The pressure vessel 200 of the loadlock chamber 112 includes an access port 230 through which processed and unprocessed substrates are passed between the loadlock chamber 112 and the factory interface 104 when the slit valve 118 is opened. The access port 230 may be sealed by the slit valve 118 in the closed position (FIG. 5f) when the pressure within the chamber 112 is to be lowered.

The staging robot 116 of the factory interface 104 places an unprocessed substrate 232 on an unprocessed substrate support structure indicated schematically at 234 in the loadlock chamber 112. In the illustrated embodiment, the support structure 234 in the illustrated embodiment, has a lower position (FIG. 5e) which provides clearance for the lateral movements of the staging robot blade carrying the unprocessed substrate. Once the robot 116 has positioned the unprocessed substrate 232 over the support structure 234, the support structure 234 can be raised to lift the unprocessed substrate from the robot blade, permitting the robot blade of the robot 116 to be removed from the chamber. It is appreciated that other structures and mechanisms may be used to load, remove and support the substrates within the chamber.

In the illustrated embodiment, the loadlock chamber 112 has a heater 240 which may be used to heat and degas the unprocessed substrates prior to the transfer of the unprocessed substrates to the transfer chamber 150 for processing in the process chambers 170. The heater 240 may be disposed within the chamber interior or alternatively may be positioned on the exterior of the loadlock chamber adjacent to a chamber window through which heat energy may be transferred into the chamber interior. If a window is utilized, the window is preferably made of quartz but may be made of any suitable material which is substantially transparent or conductive of thermal energy.

Preferably, the heater 240 includes conventional resistive heating lamps. Alternatively, the unprocessed substrate support structure may include resistive heating elements disposed thereon or embedded therein to heat the substrates and the chamber interior prior to transferring the unprocessed substrate to the transfer chamber.

As previously mentioned, the loadlock chamber 112 has a cooling plate 140 upon which a processed substrate may be cooled prior to being transferred to the factory interface area 104. The cooling plate may be shaped so as to optimize cooling depending upon the particular application. Other structures may also be used to cool the processed substrates and alternatively, the cooling structure may be omitted. Lift pins or other structures may be used to lift the processed substrate from the cooling plate prior to transfer to the staging robot 116. Conversely, the transfer robot 152 can deposit a processed substrate onto the cooling plate lift pins which then lower the processed substrate onto the cooling plate or other support structure. The injector 130 may assist in cooling the processed substrate in addition to dislodging particles from the surface of the substrate.

The operations of the system 100 are controlled by a controller 250 which, in the illustrated embodiment, is a programmed workstation. It is appreciated that other types of controllers may be used including dedicated control circuitry. In operation, a processed substrate 142 is transferred from the buffer chamber 150 by the transfer robot 152 and is deposited onto the cooling plate 140 of the load lock chamber 112 as indicated in FIGS. 5a and 5b described in step 260 of FIG. 4a. An unprocessed substrate 232 may also be unloaded from the load lock chamber 112 by the transfer robot 152 as indicated in process step 262 and FIG. 5b, for processing in the process chambers 170. The buffer side slit valve 160 may then be sealed (step 264, FIG. 5c) and the control valve 144 may be opened to admit the purge gas into the chamber interior 120 through the gas injector as indicated into step 264 and FIG. 5c.

In the illustrated embodiment, the flow rate through the injector 130 is regulated by the regulator 146 to provide a relatively slow or soft vent. To increase the overall venting rate, the control valve 244 may be opened as well to admit the purge gas into the chamber interior 120 through the main gas inlet 220 as indicated in step 266 and FIG. 5d.

Once the chamber interior 120 has reached a pressure which is approximately the same as but more preferably is somewhat higher than that of the chamber exterior 122, the control valve 224 may be closed (step 268, FIG. 4b) to terminate the fast vent as shown in FIG. 5e. In addition, the factory interface side slit valve 118 may be opened to permit an unprocessed substrate to be placed into the chamber 112 by the factory interface side robot 116. However, it is preferred that the control valve 144 remain open while the slit valve 118 is open to ensure a positive pressure differential between the chamber interior and exterior through the open slit valve 118. It is believed that such an arrangement inhibits the flow of oxygen or other contaminants into the chamber interior 120 while the slit valve 118 is open. At this time, the processed substrate 142 may be removed (step 270) from the chamber as shown in FIG. 5f and placed in a cassette 108 by the robot 116 (FIG. 1).

The factory side slit valve 118 may then be sealed (step 272) as shown in FIG. 5g and the control valve 144 may also be closed to terminate the flow of purge gas through the slow vent injector 130. In addition, pumping may be initiated to lower the pressure in the chamber interior. Still further, the heater 240 may be activated to begin degassing the unprocessed substrate within the chamber. Because oxidation of the substrate may be enhanced by heating the substrate, it is often desired to defer initiation of the degas process until the loadlock chamber has been pumped down sufficiently to remove a substantial portion of any oxygen which may have entered the chamber while the factory side slit valve is open.

In many applications, degassing may be initiated at a low pressure such as 1 or 1.5 Torr. If the pressure at which pumping begins is approximately 760 Torr, a significant amount of time may be expended pumping the chamber pressure down to the 1 Torr range before initiating degassing. However, in accordance with one aspect of the present invention, it is believed that the pressure at which degassing may be initiated without an unacceptable degree of oxidation can be substantially higher, that is, substantially earlier, when, in the earlier step, a positive pressure gradient is maintained by pumping purge gas into the chamber interior while the factory side slit valve is open. The higher the pressure at which degassing is initiated, the longer the duration of time available for degassing before the final evacuation pressure is reached. In some applications, it is anticipated that degassing may be initiated at a pressure in the range of 10–760 Torr. As a consequence, degassing may be terminated more early or may be conducted for a longer length of time, depending upon the application.

Once the pressure of the transfer chamber has been reached (step 274) and the degassing operation is complete, the transfer chamber side slit valve 160 may be opened as shown in FIG. 5h. The process may then be repeated by loading (step 260) a new processed substrate 142 (FIG. 5a) and unloading (step 262) the unprocessed and degassed substrate 232 from the chamber 112 through the open transfer chamber side slit valve 160.

It will, of course, be understood that modifications of the illustrated embodiments, in their various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments described herein but should be defined by the appended claims and equivalents thereof.

What is claimed is:

1. A method of processing a semiconductor substrate in a heating chamber having a valve through which a substrate may be selectively loaded into and unloaded from said heating chamber, comprising:

pressurizing the interior of said heating chamber containing a processed substrate with a purge gas to a pressure greater than the pressure external to said valve to provide a positive pressure differential between said chamber interior and said valve external pressure;

opening said chamber valve;

admitting said purge gas into said chamber interior while said chamber valve is open to maintain a positive pressure differential while said chamber valve is open;

removing a said processed substrate from said chamber interior through said opened chamber valve;

loading an unprocessed substrate into said chamber interior through said opened chamber valve;

closing said chamber valve;

pumping gas from said chamber interior to lower the chamber interior pressure; and heating said unprocessed substrate while pumping said chamber.

2. The method of claim 1 wherein said purge gas admitting is controlled to be in a range of 20–4000 sccm.

3. The method of claim 2 wherein said purge gas admitting is controlled to be in a range of 100–2000 sccm.

4. The method of claim 1 wherein said purge gas is selected from the group consisting of argon, helium and nitrogen.

5. The method of claim 1 wherein said heating is initiated when said interior pressure is in a range of 10–760 Torr.

6. The method of claim 1 further comprising opening a second chamber valve and unloading said unprocessed substrate through said opened second valve after said unprocessed substrate is heated.

7. The method of claim 6 further comprising loading a processed substrate through said opened second valve and closing said second valve and repeating said pressurizing.

8. A method of processing a semiconductor substrate, comprising:

loading a processed substrate from a process chamber into an opened load lock chamber having a first interior pressure;

closing the load lock chamber;

admitting a purge gas into the load lock chamber to vent the load lock chamber to a second, higher pressure greater than ambient pressure and to cool the substrate;

opening the load lock chamber and continuing to admit said purge gas into the chamber interior while the chamber is open;

removing the processed substrate from the opened load lock chamber and loading it into a cassette at ambient pressure;

loading an unprocessed substrate from a cassette at ambient pressure into the opened load lock chamber;

closing the load lock chamber;

pumping gas from the chamber interior to lower the chamber interior pressure; and heating the unprocessed substrate to degas the unprocessed substrate while pumping the chamber wherein the heating is initiated at a load lock chamber interior pressure in a range of 10–760 Torr.

9. A system for processing a semiconductor substrate, comprising:
a chamber having a slit valve through which a substrate may be selectively loaded into and unloaded from said chamber, and a heater adapted to heat a substrate in said chamber,
a purge gas inlet adapted to admit a purge gas into the interior of said chamber;
a pump coupled to said chamber and adapted to pump gas from the interior of said chamber;
a robot adapted to load substrates through said chamber valve into said chamber; and
a controller adapted to control said valve, pump, inlet and robot to pressurize the interior of said heating chamber with a purge gas to a pressure greater than the pressure external to said valve to provide a positive pressure differential between said chamber interior and said valve external pressure; to open said chamber valve; to admit said purge gas into said chamber interior while said chamber valve is open to maintain a positive pressure differential while said chamber valve is open; to load a substrate into said chamber interior through said opened chamber valve; to close said chamber valve; to pump gas from said chamber interior to lower the chamber interior pressure; and to heat said unprocessed substrate while pumping said chamber wherein said controller initiates said heating when said interior pressure is in a range of 10–760 Torr.

10. A load lock system for transferring a semiconductor substrate from ambient pressure to a vacuum pressure, said system for use with a purge gas source and a pump, comprising:
a load lock chamber having a slit valve through which a substrate may selectively loaded into and unloaded from said chamber, and a heater adapted to heat a substrate in said chamber,
a purge gas inlet adapted to be coupled to said source and to admit a purge gas into the interior of said chamber; and
a controller adapted to control said valve, pump, and inlet to pressurize the interior of said heating chamber with a purge gas to a pressure greater than the ambient pressure external to said valve to provide a positive pressure differential between said chamber interior and said valve external pressure; to open said chamber valve; to admit said purge gas into said chamber interior while said chamber valve is open to maintain a positive pressure differential while said chamber valve is open; to load a substrate into said chamber interior through said opened chamber valve; to close said chamber valve after an unprocessed substrate is loaded into said chamber interior; to pump gas from said chamber interior to lower the chamber interior pressure; and to heat said unprocessed substrate while pumping said chamber wherein said controller initiates said heating when said interior pressure is in a range of 10–760 Torr.

11. The load lock system of claim 10 wherein controller controls said inlet to admit said purge gas in a range of 20–4000 sccm.

12. The load lock system of claim 11 wherein controller controls said inlet to admit said purge gas in a range of 100–2000 sccm.

13. The load lock system of claim 10 wherein said purge gas is selected from the group consisting of argon, helium and nitrogen.

14. A system for processing a semiconductor substrate, comprising:
a load lock chamber having a slit valve through which a substrate may be selectively loaded into and unloaded from said chamber, and a heater adapted to heat a substrate in said chamber,
a purge gas inlet adapted to admit a purge gas into the interior of said chamber;
a pump coupled to said chamber and adapted to pump gas from the interior of said chamber;
a cassette;
a robot adapted to load and unload substrates through said chamber valve between said chamber and said cassette; and
a controller adapted to control said valve, pump, inlet and robot to pressurize the interior of said heating chamber with a purge gas to a pressure greater than the pressure external to said valve to provide a positive pressure differential between said chamber interior and said valve external pressure; to open said chamber valve; to admit said purge gas into said chamber interior while said chamber valve is open to maintain a positive pressure differential while said chamber valve is open; to unload a processed substrate from said chamber interior through said opened chamber valve; to load an unprocessed substrate into said chamber interior through said opened chamber valve; to close said chamber valve; to pump gas from said chamber interior to lower the chamber interior pressure; and to heat said unprocessed substrate while pumping said chamber.

15. The system of claim 14 wherein said controller initiates said heating when said interior pressure is in a range of 10–760 Torr.

16. The system of claim 14 wherein said load lock chamber has a second slit valve through which a substrate may selectively loaded into and unloaded from said load lock chamber; said system further comprising a transfer chamber; and a second robot adapted to load and unload substrates through said second slit valve between said load lock chamber and said transfer, said controller being further adapted to open said second valve and unload said unprocessed substrate through said opened second valve after said unprocessed substrate is heated.

17. A system for processing a semiconductor substrate, comprising:
a load lock chamber having a slit valve through which a substrate may be selectively loaded into and unloaded from said chamber, and a heater adapted to heat a substrate in said chamber,
a purge gas inlet adapted to admit a purge gas into the interior of said chamber;
a pump coupled to said chamber and adapted to pump gas from the interior of said chamber;
a cassette;
a robot adapted to load and unload substrates through said chamber valve between said chamber and said cassette; and
controller means for controlling said valve, pump, inlet and robot to pressurize the interior of said heating chamber with a purge gas to a pressure greater than the pressure external to said valve to provide a positive pressure differential between said chamber interior and said valve external pressure; for opening said chamber valve; to admit said purge gas into said chamber interior while said chamber valve is open to maintain a positive pressure differential while said chamber valve is open; to unload a processed substrate from said chamber interior through said opened chamber valve; to load an unprocessed substrate into said chamber interior through said opened chamber valve; to close said chamber valve; to pump gas from said chamber interior to lower the chamber interior pressure; and to heat said unprocessed substrate while pumping said chamber.

18. The system of claim 17 wherein said controller means initiates said heating when said interior pressure is in a range of 10–760 Torr.

19. The system of claim 17 wherein said load lock chamber has a second slit valve through which a substrate may selectively loaded into and unloaded from said load lock chamber; said system further comprising a transfer chamber; and a second robot adapted to load and unload substrates through said second slit valve between said load lock chamber and said transfer, said controller means further for controlling said second slit valve and said second robot to open said second valve and unload said unprocessed substrate through said opened second valve after said unprocessed substrate is heated.

20. The system of claim 17 wherein controller means controls said inlet to admit said purge gas in a range of 100–2000 sccm.

* * * * *